United States Patent
Abbasfar et al.

(10) Patent No.: US 11,632,127 B2
(45) Date of Patent: Apr. 18, 2023

(54) NEAR-OPTIMAL TRANSITION ENCODING CODES

(71) Applicant: Samsung Display Co., Ltd., Yongin-si (KR)

(72) Inventors: Aliazam Abbasfar, Santa Clara, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/506,481

(22) Filed: Oct. 20, 2021

(65) Prior Publication Data

US 2023/0041347 A1 Feb. 9, 2023

Related U.S. Application Data (60) Provisional application No. 63/229,401, filed on Aug. 4, 2021.

(51) Int. Cl.
| | |
|---|---|
| *H03M 7/00* | (2006.01) |
| *H03M 7/46* | (2006.01) |
| *H03M 7/30* | (2006.01) |

(52) U.S. Cl.
CPC ........... *H03M 7/46* (2013.01); *H03M 7/3064* (2013.01); *H03M 7/6005* (2013.01); *H03M 7/6011* (2013.01)

(58) Field of Classification Search
None
See application file for complete search history.

(56) References Cited

U.S. PATENT DOCUMENTS

| | | |
|---|---|---|
| 5,774,078 A | 6/1998 | Tanaka et al. |
| 6,476,737 B1 | 11/2002 | Caroselli et al. |
| 7,187,307 B1 | 3/2007 | Schmidt et al. |
| 7,667,626 B1 | 2/2010 | Chaichanavong et al. |
| 7,721,179 B2 | 5/2010 | Kim et al. |
| 8,365,053 B2 | 1/2013 | Cassidy |
| 9,166,769 B2 | 10/2015 | Lee |

(Continued)

FOREIGN PATENT DOCUMENTS

| | | |
|---|---|---|
| CN | 101019348 A | 8/2007 |
| CN | 108028667 A | 5/2018 |

(Continued)

OTHER PUBLICATIONS

European Search Report for EP Application No. 22188786.2 dated Dec. 9, 2023, 9 pages.

(Continued)

*Primary Examiner* — Jean B Jeanglaude
(74) *Attorney, Agent, or Firm* — Lewis Roca Rothgerber Christie LLP (57) ABSTRACT

A method of encoding input data includes dividing the input data into a plurality of data packets, an input packet of the plurality of data packets including a plurality of digits in a first base system, base-converting the input packet from the first base system to generate a base-converted packet including a plurality of converted digits in a second base system, the second base system having a base value lower than that of the first base system, and incrementing the converted digits to generate a coded packet for transmission through a communication channel.

20 Claims, 4 Drawing Sheets

(56) References Cited

U.S. PATENT DOCUMENTS

| | | |
|---|---|---|
| 9,319,179 B1 | 4/2016 | Ahirwar et al. |
| 9,431,053 B2 | 8/2016 | Cai et al. |
| 9,729,681 B2 | 8/2017 | Lee |
| 9,852,757 B2 | 12/2017 | Cai et al. |
| 10,581,464 B2 | 3/2020 | Berggren et al. |
| 10,812,102 B2 * | 10/2020 | Cornelius ............ H03M 7/3059 |
| 10,972,126 B2 * | 4/2021 | Penney ................... H03M 7/30 |
| 2016/0197622 A1 * | 7/2016 | Ackerman ........... H03M 7/6011 |
| | | 707/693 |
| 2020/0007155 A1 * | 1/2020 | Cornelius ............... H03M 7/46 |
| 2022/0368342 A1 | 11/2022 | Abbasfar |

FOREIGN PATENT DOCUMENTS

| | | |
|---|---|---|
| EP | 0765544 B1 | 2/2003 |
| EP | 1762021 A1 | 3/2007 |
| EP | 3 338370 | 6/2018 |
| EP | 4087138 A1 | 11/2022 |
| JP | 4339382 | 7/2009 |
| KR | 10-0651343 B1 | 11/2006 |
| WO | WO 2006031070 A1 | 3/2006 |
| WO | WO 2017/050377 A1 | 3/2017 |

OTHER PUBLICATIONS

Van Wijngaarden, et al. "Construction of Maximum Run-Length Limited Codes Using Sequence Replacement Techniques," IEEE Journal on Selected Areas in Communications, vol. 28, No. 2, Feb. 2010, pp. 200-207.

* cited by examiner

NEAR-OPTIMAL TRANSITION ENCODING CODES

CROSS-REFERENCE TO RELATED APPLICATION(S)

This application claims priority to, and the benefit of, U.S. Provisional Application No. 63/229,401 ("NEAR OPTIMAL PACKET-BASED LIMITED RUN-LENGTH CODES"), filed on Aug. 4, 2021, the entire content of which is incorporated herein by reference.

FIELD

Aspects of embodiments of the present disclosure are generally related to data communication systems.

BACKGROUND

Generally, serial data communication is commonly used in a variety of systems communicating over wires, over optical fibers, and even wirelessly. In serial communication of digital data, when a transmitter does not transmit the clock signal with the data stream, the receiver has to regenerate the clock using the timing information from the data stream. The process of extracting timing information from a serial data stream is known as clock recovery and is crucial for allowing the receiver circuit to decode the transmitted symbols.

Clock recovery at the receiver can be assisted by modifying the transmitted data to ensure that there are a sufficient number of transitions within a data stream. In other words, the worst-case no-transition run-length has to be limited. To ensure frequent transitions, a transmitter may utilize a transition encoding algorithm to encode the raw data such that transitions happen regularly. Encoding the data in this manner entails the use of redundant (overhead) bits, which can impact transmission efficiency.

The above information disclosed in this Background section is only for enhancement of understanding of the present disclosure, and therefore it may contain information that does not form the prior art that is already known to a person of ordinary skill in the art.

SUMMARY

Aspects of embodiments of the present disclosure are directed to a system and method for efficiently encoding a transmission stream to enable clock recovery at the receiver. In some embodiments, the transmitter encodes the data stream using very-low-overhead and high-code-efficiency run-length-limited transition codes.

Aspects of embodiments of the present disclosure are directed to a system and method for recovering a clock signal from a data stream utilizing a very-low-overhead and high-code-efficiency run-length-limited transition code.

According to some embodiments of the present invention, there is provided a method of encoding input data, the method including: dividing the input data into a plurality of data packets, an input packet of the plurality of data packets including a plurality of digits in a first base system; base-converting the input packet from the first base system to generate a base-converted packet including a plurality of converted digits in a second base system, the second base system having a base value lower than that of the first base system; and incrementing the converted digits to generate a coded packet for transmission through a communication channel.

In some embodiments, a number of the plurality of converted digits in the base-converted packet is one more than a number of the plurality of digits in the input packet.

In some embodiments, the incrementing the converted digits includes: incrementing each of the converted digits by one to generate coded digits, the coded packet including the coded digits.

In some embodiments, the coded packet has a run-length less than or equal to a set run-length value.

In some embodiments, the input packet includes N digits, each of the N digits including q bits, wherein the first base system is a base $2^q$ system, and the second base system is a base $2^q-2$ system, and wherein the coded packet has a run-length less than or equal to $2^q-2$.

In some embodiments, the input packet includes N digits, each of the N digits including q bits, and the first base system is a base $2^q$ system, and the second base system is a base $2^q-3$ or less system.

In some embodiments, the input packet is an N-digit base-$2^q$ number expressed as $X=[x_1 x_2 \ldots x_N]_2^q$, wherein each of digits $x_1, x_2, \ldots x_N$ has a value from 0 to $2^q-1$, wherein the base-converted packet is an (N+1)-digit ($2^q-2$) number expressed as $X=[y_0 y_1 y_2 \ldots y_N]_{2^q-2}$, and wherein each of the plurality of digits $y_1, \ldots y_N$ has a value from 0 to $2^q-3$.

In some embodiments, an overhead digit $y_0$ has a value from 0 to $2^q-3$, and values N and q have a relationship expressed as: $N \leq 1/(\log(2^q)/\log(2^q-2)-1)$.

In some embodiments, an overhead digit $y_0$ is a single binary bit, and values N and q have a relationship expressed as: $N \leq \log 2/(\log(2^q)-\log(2^q-2))$.

In some embodiments, the coded packet is expressed as $X'=\{y_0+1, y_1+1, y_2+1, \ldots, y_N+1\}$, and each of coded digits $y_0+1 \ldots y_N+1$ do not include all zeros or all ones.

In some embodiments, the base-converting the input packet includes an iterative process including only shift, addition, and subtraction operations.

In some embodiments, the coded packet includes at least one bit transition.

In some embodiments, the method further includes: transmitting transmission data to a receiver through the communication channel, the transmission data including the coded packet.

According to some embodiments of the present invention, there is provided a transition encoder for encoding input data, the transition encoder including: a processor; and a processor memory local to the processor, wherein the processor memory has stored thereon instructions that, when executed by the processor, cause the processor to perform: dividing the input data into a plurality of data packets, an input packet of the plurality of data packets including a plurality of digits in a first base system; base-converting the input packet from the first base system to generate a base-converted packet including a plurality of converted digits in a second base system, the second base system having a base value lower than that of the first base system; and incrementing the converted digits to generate a coded packet for transmission through a communication channel.

According to some embodiments of the present invention, there is provided a method of decoding transmission data, the method including: dividing the transmission data into a plurality of coded packets, a coded packet of the plurality of coded packets including a plurality of coded digits in a first base system; decrementing the plurality of coded digits to generate a converted packet; and base-converting the converted packet from the first base system to generate a decoded packet including a plurality of decoded digits in a second base system, the second base system having a base value greater than that of the first base system.

In some embodiments, a number of the plurality of coded digits in the coded packet is one more than a number of the plurality of decoded digits in the decoded packet.

In some embodiments, the decrementing the coded digits includes: decrementing each of the coded digits by one to generate converted digits, the converted packet including the converted digits.

In some embodiments, each of the coded packets has a run-length less than or equal to a set run-length value.

In some embodiments, the method further includes: receiving the transmission data from a transmitter through a communication channel.

According to some embodiments of the present invention, there is provided a transition decoder for decoding a transmission data, the transition decoder including: a processor; and a processor memory local to the processor, wherein the processor memory has stored thereon instructions that, when executed by the processor, cause the processor to perform: dividing the transmission data into a plurality of coded packets, a coded packet of the plurality of coded packets including a plurality of coded digits in a first base system; decrementing the plurality of coded digits to generate a converted packet; and base-converting the converted packet from the first base system to generate a decoded packet including a plurality of decoded digits in a second base system, the second base system having a base value greater than that of the first base system.

BRIEF DESCRIPTION OF THE DRAWINGS

The accompanying drawings, together with the specification, illustrate example embodiments of the present disclosure, and, together with the description, serve to explain the principles of the present disclosure.

DETAILED DESCRIPTION

The detailed description set forth below is intended as a description of example embodiments of a system and method for transition encoding/decoding data in serial data communication, provided in accordance with the present disclosure, and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
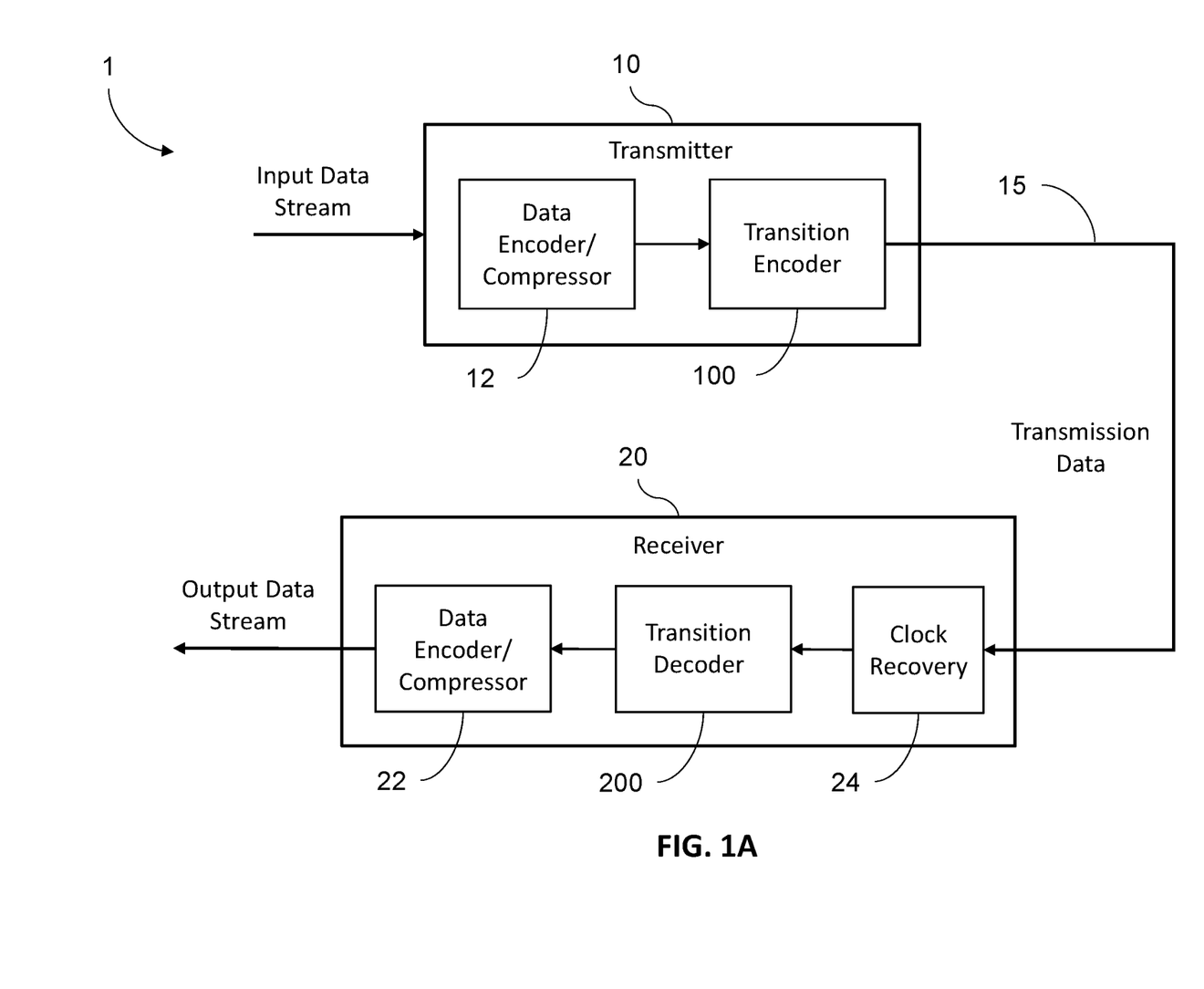
FIG. 1A is a block diagram of a serial data communication system, according to some embodiments of the present disclosure.
Figure 1B:
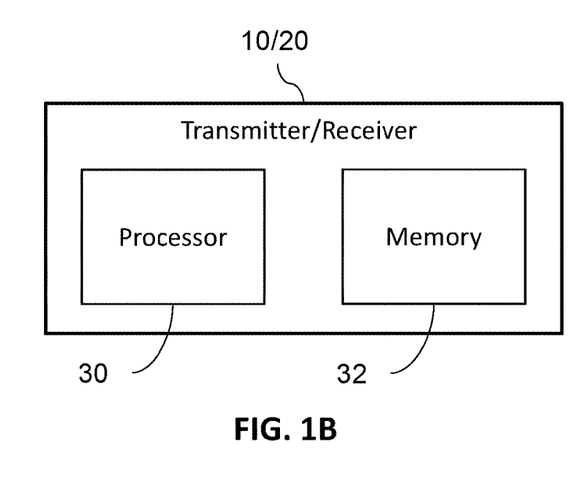
FIG. 1B illustrates a block diagram of a transmitter/receiver of the serial data communication system, according to some embodiments of the present disclosure.

FIG. 1A is a block diagram of a serial data communication system 1, according to some embodiments of the present disclosure. FIG. 1B illustrates a block diagram of a transmitter/receiver of the serial data communication system 1, according to some embodiments of the present disclosure.

Referring to FIG. 1A, in some embodiments, the serial data communication system 1 includes a transmitter 10, a communication channel (e.g., serial communication channel) 15, and a receiver 20. The transmitter 10 may include a data compressor and/or encoder 12 for performing compression and/or encoding on an input data stream to generate transmission data for transmission through the communication channel 15 to the receiver 20. The receiver 20 may include a data decompressor and/or decoder 22 for performing decompression and/or decoding on the data stream received by the receiver 20 to recover the input data stream.

According to some embodiments, the transmitter 10 includes a transition encoder 100 configured to encode the transmission data stream by ensuring that transitions occur with at least a particular frequency that enables the receiver 20 to extract the clock signal from the coded data stream (e.g., transition-encoded) transmitted over the communication channel 15. That is, the transition encoder 100 limits the run-length of the coded data stream.

As shown in FIG. 1B, the operations performed by the constituent components of the transmitter 10 and the receiver 20 may be performed by a "processing circuit" or "processor" 30 that may include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example, a processing circuit may include two processing circuits, an FPGA and a CPU, interconnected on a PWB. A processor memory 32 that is local to the processor 30 may have stored thereon instructions that, when executed by the processor 30, cause the processor 30 to perform the operations described herein with respect to FIGS. 1A and 2-4.

Figure 2:
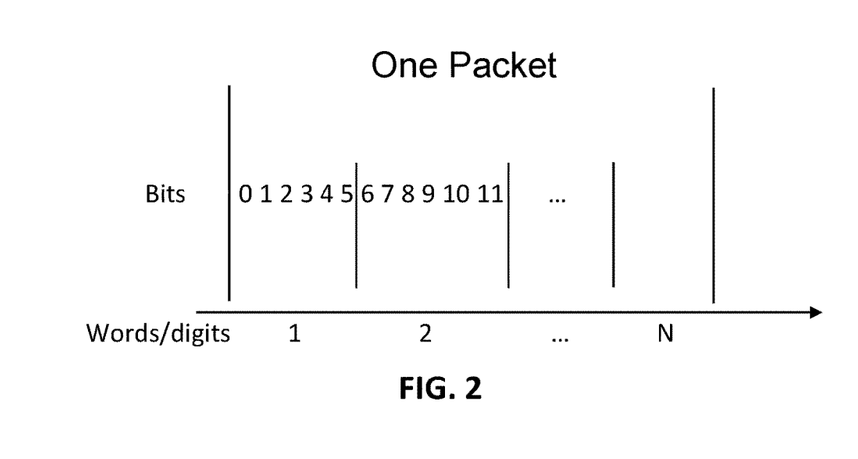
FIG. 2 illustrates a packet of data that is partitioned into a number of words, according to some embodiments of the present disclosure.

FIG. 2 illustrates a packet of data that is partitioned into a number of words, according to some embodiments of the present disclosure.

Referring to FIGS. 1A and 2, in some embodiments, the transition encoder 100 divides the input data (that may or may not have been encoded/compressed by the data compressor and/or encoder 12) into a number of input data packets (e.g., bit streams). Each input data packet (also referred to as input packets) is partitioned into N words/digits, where each word/digit contains q bits. Thus, the data packet X may be represented as:

$$X[0:q \times N-1] = x_1(b[0:q-1]), x_2(b[q:2q-1]), \ldots x_N(b[q \times (N-1):(q \times N)-1]) \qquad \text{Eq(1)}$$

where $x_1, x_2, \ldots, x_N$ represent the N words/digits making up the input packet, and each has a value between 0 to $2^{q-1}$. In the example of FIG. 2, each word includes 6 bits (i.e., q=6) and has a value in the [0:63] range.

In some embodiments, the transition encoder 100 guarantees transitions in every word/digit by encoding the stream in a way to eliminate words/digits with all zeros (digit value of 0) or all ones (digit value of $2^q-1$). This limits the run-length of the transition-encoded stream to 2q-2. As an example, in the case of a 6-bit word (i.e., q=6), the worst case scenario for runs in two consecutive words/digits is 100000 000001 or 011111 111110, which translates to a run-length of 10 (=2×6-2).

According to some embodiments, the transition encoder 100 treats the input packet as an N-digit base-$2^q$ number, where $x_1$ is in the most significant digit (MSD) and $x_N$ is in the least significant digit (LSD) of the base-$2^q$ number. Thus, the packet X may be expressed as:

$$X=[x_1x_2\ldots x_N]_{2^q} \qquad \text{Eq(2)}$$

Where each of the digits $x_1, x_2, \ldots x_N$ has a value ranging from 0 to $2^q-1$. In the example of q=6, the packet is an N-digit base-64 number $X=[x_1x_2\ldots x_N]_{64}$. The transition encoder 100 then converts this number to base $2^q-2$ (e.g., base 62 for q=6). The base $2^q-2$ number (i.e., the base-converted packet) may be expressed as:

$$X=[y_0y_1y_2\ldots y_N]_{2^q-2} \qquad \text{Eq(3)}$$

Where each of the converted digits $y_0, y_1, \ldots y_N$ has a value ranging from 0 to $2^q-3$. In the example of q=6, the base-converted packet may be expressed as $X=[y_0y_1y_2\ldots y_N]_{62}$, where each of converted digits $y_0, y_1, \ldots y_N$ has a value ranging from 0 to 61. Given that the value range of the converted digits y is less than the digits x, more converted digits y may be used than the digits x to represent the data packet X. As such, the value of N (i.e., the number of base-$2^q$ digits in the data packet) may be chosen such that only one additional digit (i.e., the overhead digit), $y_0$, is used to represent the data packet. The transition encoder 100 then increments the converted digits by one and generates a coded packet X' as:

$$X'=\{y_0+1, y_1+1, y_2+1, \ldots, y_N+1\} \qquad \text{Eq(4)}$$

As such, the coded words/digits, $y_0+1 \ldots y_N+1$ that are transmitted to the receiver 20 do not include all zeros or all ones. That is the coded digits exclude 0 and $2^q-1$ (e.g., 63, when q=6). Therefore, the transmitter 10 can guarantee a transition in every coded digit being transmitted and ensure a limited run-length of 2q-2 (e.g., 10 in the case of q=6).

The maximum value that the base-converted data packet X can represent in base $2^q-2$ and with N+1 digits (i.e, $y_0, y_1, y_2 \ldots y_N$) is $(2^q-2)^{N+1}$. The maximum value that original data packet X (i.e., the unconverted data packet) can represent in the original base $2^q$ and with N digits (i.e, $x_1, x_2 \ldots x_N$) is $(2^q)^N$. To ensure that the base-converted data packet can represent at least all values of the input packet (i.e., the unconverted-base packet) X, the following relationship holds:

$$(2^q-2)^{N+1} \geq (2^q)^N \qquad \text{Eq(5)}$$

from which the upper limit for the number of words N in the data packet X can be derived as $$N \leq 1/(\log(2^q)/\log(2^q-2)-1) \qquad \text{Eq(6)}$$

In the example of a 6-bit word (i.e., q=6), the upper limit for N is $$N \leq 1/(\log(64)/\log(62)-1)=129.99$$

Therefore, if the original data packet size (i.e., the number of words in the input packet) N≤129, the converted data packet, and thus the coded data packet, has only one additional word/digit. In other words, the overhead of this transition-encoding scheme is one word. In the example of q=6, this leads to a code efficiency of $$\text{Efficiency}=6\times129/(6+6\times129)=99.2\%$$

The less than 1% overhead of the encoding performed by the transition encoder 100 is near optimal and is a significant improvement over the packet encoding schemes of the related art, which may be able to achieve a code efficiency of less than 97% for q=6.

The transmitter 10 (e.g., the transition encoder 100) transmits the coded packets as a transmitted data stream to the receiver 20. When recovering the clock signal from the coded packets received through the communication channel 15, the clock recovery circuit 24 of the receiver 20 may update the coded packet N times (e.g., once for each word/digit/symbol). For large values of N, this may be a computationally intensive process and may introduce processing delays.

Thus, in some embodiments, to simplify the receiver implementation, the transition encoder 100 limits N to lower values by setting the overhead digit $y_0$ to either 0 or 1 (i.e., limiting $y_0$ to be a single binary bit, rather than a q-bit word/digit). With $y_0$ as a 1-bit code overhead, the maximum number that X can represent is $2*(2^q-2)^N$. Therefore, to ensure that the base-converted data packet can represent at least all values of the input packet (i.e., the unconverted-base packet) X, the following relationship holds:

$$2*(2^q-2)^N \geq (2^q)^N \qquad \text{Eq(7)}$$

as a result:

$$N \leq \log 2/(\log(2^q)-\log(2^q-2)) \qquad \text{Eq(8)}$$

For the example of a 6-bit word (q=6), Equations 7 and 8 become $$2*62^N \geq 64^N$$

$$N \leq \log 2/(\log(64)-\log(62))=21.83$$

In other words, for a packet size of N≤21, there is only one bit overhead. Thus, the code efficiency is $$\text{Efficiency}=21*6/(1+21*6)=99.2\%$$

In some embodiments, the transition encoder 100 pools together the overhead bits of a number of packets (e.g., q-1 packets) to form an overhead word of q bits and transmits the overhead word after the corresponding packets. The overhead word includes q-1 overhead bits from the corresponding q-1 packets and one transition bit for the overhead word (for a total of q bits). Using this scheme, for q=6, the code efficiency can be calculated as $$\text{Efficiency}=(5*21*6)/(5+1+5*21*6)=99.1\%,$$

which is still nearly optimal coding efficiency.

According to some embodiments, the transition decoder 200 of the receiver 20 retrieves the original data packet from the coded data packet X', which is transmitted over the communication channel 15, by performing the reverse of the operations described above with respect to the transition encoder 100.

According to some examples, the transition encoder 100 and the transition decoder 200 utilize an iterative process for performing base conversion, which is based on the insight that the original data packet in base $2^q$ can be written in base 10 as $$X=[x_1 x_2 \ldots x_N]_2^q = ( \ldots ((x_1 * 2^q + x_2) * 2^q + x_3) * + \ldots + x_N)_{10} \quad \text{Eq(9)}$$

In the example of q=6, $$X=[x_1 x_2 \ldots x_N]_{64} = ( \ldots ((x_1 * 64 + x_2) * 64 + x_3) * + \ldots + x_N)_{10}$$

Initially, in the first iteration of the base-conversion process, the transition encoder 100 calculates an initial value A that is defined as $$A = x_1 = [z_0, z_1]_2^q{}_{-1} = (z_0 * (2^q - 2) + z_1)_{10}$$

In some examples, the transition encoder 100 may determine $z_0$ and $z_1$ by setting $z_0=1$ and $z_1 = x_1 - (2^q - 2)$ when $x_1$ is greater than $2^q - 3$ (e.g., 61 for q=6), and by setting $z_0=0$ and $z_1 = x_1$ otherwise.

In each iteration, the transition encoder 100 computes new $A = (A * 2^q + x_n)_{10}$ in base $2^q - 2$, where we have base $2^q - 2$ of old $A = [z_0, z_1, \ldots, z_n]$. The output is new $A = [z_0, z_1, \ldots, z_n, z_{n+1}]_2^q{}_{-2}$ (where these may be all new $z_i$)

$$\text{New } A = (A * 2^q + x_n)_{10} = (A * (2^q - 2) + A * 2 + x_n)_{(10)} =$$

$$= ([z_0, z_1, \ldots, z_n]_2^q{}_{-2} * (2^q - 2) + [z_0, z_1, \ldots, z_n]_2^q{}_{-2} * 2 + x_n)$$

$$= ([z_0, z_1, \ldots, z_n, 0]_2^q{}_{-2} + [2z_0, 2z_1, \ldots, 2z_n]_2^q{}_{-2} + x_n)$$

Here, that the notation $[z_0, z_1, \ldots, z_n, 0]_2^q{}_{-2}$ is used as the decimal value of $A*(2^q-2)$, and $[2z_0, 2z_1, \ldots, 2z_n]_2^q{}_{-2}$ is used as the decimal value of $A*2$. The former is a true base $(2^q-2)$ notation, but the latter is just a fictitious notation that provides the true value for $A*2$ when weighed by the $(2^q-2)$ base system.

Next, the transition encoder 100 converts $x_n$ to base $(2^q-2)$ (similar to the initialize step of the first iteration), $x_n = [y_0, y_1]_2^q{}_{-2} = (y_0 * (2^q - 2) + y_1)_{10}$ The variables $z_i$ and $y_i$ are q-bit numbers. Thus far, all the operations may be performed using shift and addition. The additions may be performed in the base $2^q-2$ system.

New $z_{n+1} = y_1 + 2z_n \mod(2^q-2)$

New $z_n = c_{n+1} + y_0 + 2z_{n-1} + z_n \mod(2^q-2)$ where $c_{n+1}$ is the carry coming from $z_n$ calculation (divisor of $y_1 + 2z_n$ divided by $(2^q-2)$).

New $z_{n-1} = c_n + 2z_{n-2} + z_{n-1} \mod(2^q-2) \ldots$

New $z_2 = c_3 + 2z_1 + z_2 \mod(2^q-2)$

New $z_1 = c_2 + 2z_0 + z_1 \mod(2^q-2)$

New $z_0 = c_1 + z_1 \mod(2^q-2)$

After N iterations, one can obtain $X = A = [z_0, z_1, \ldots, z_N]_2^q{}_{-2}$

In the arithmetic operations above, additions may be implemented as binary addition, irrespective of the base. Further, the $2 \times z_i$ operation may be performed using shifting binary implementation. Also, mod $(2^q-2)$ may be performed using comparison (i.e., comparing with $2^q-3$ and $2^{q+1}-5$) and subtracting afterward. The carry is also obtained here, which has a value of 0, 1, or 2. As such the iterative process described above may be implemented with shift, addition, and subtraction operations.

Similarly, at the receiver 20, the y digits with base $2^q-2$ are converted to base $2^q$. The decoded packet X may be expressed as:

$$X = [y_0 y_1 y_2 \ldots y_N]_{62} = ( \ldots ((y_0 * 62 + y_1) * 62 + y_2) * + \ldots + y_N)$$

This allows the receiver 20 to recover the decoded packet X in binary format. As noted above, only shift, addition, and subtraction operations are utilized (e.g., $y*62 = y<<6 - y<<1$).

While a particular low-complexity base-conversion technique is described herein, embodiments of the present disclosure are not limited thereto, and as will be recognized by a person of ordinary skill in the art, any suitable base conversion technique may be utilized by the transition encoder 100 and transition decoder 200. For example, in converting the data packet from base 64 to base 62, the transition encoder 100 may convert the data packet from base 64 to base 10, and then convert from base 10 to base 62.

Figure 3:
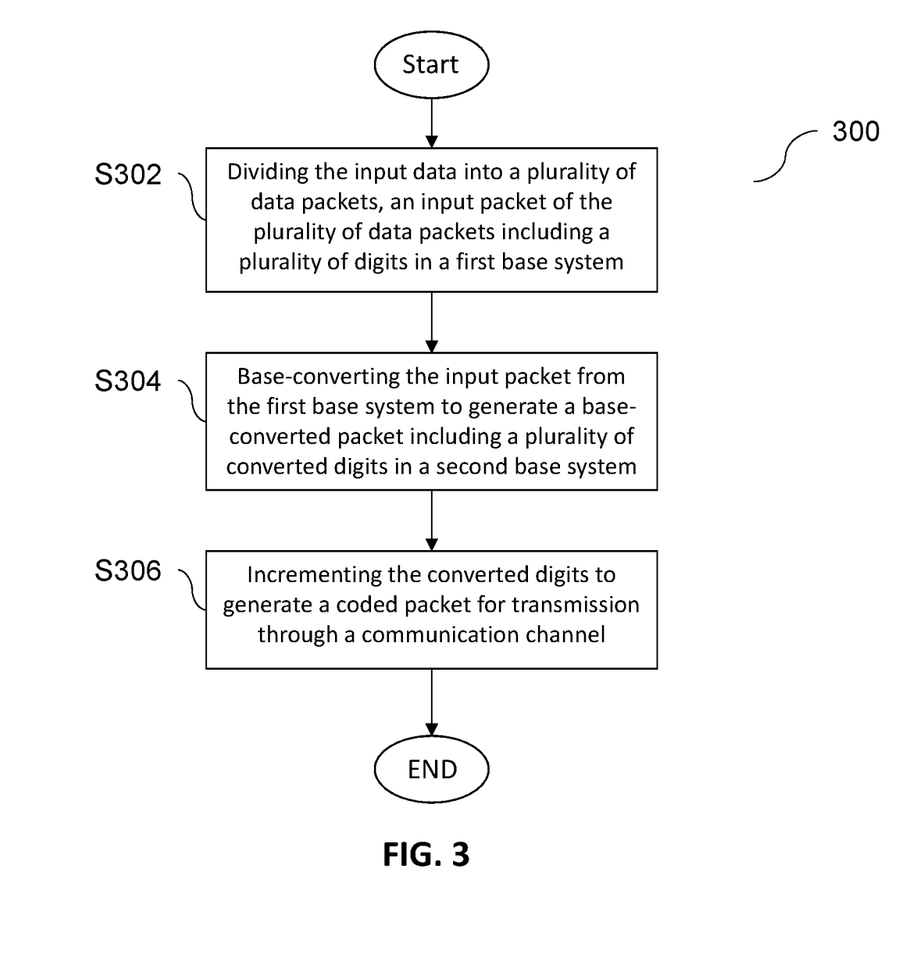
FIG. 3 illustrates a process of encoding input data, according to some embodiments of the present disclosure.

FIG. 3 illustrates a process 300 of encoding input data, according to some embodiments of the present disclosure.

In some embodiments, the transition encoder 100 divides the input data into a plurality of data packets (S302). Each of the input packets includes a plurality of digits (e.g., N digits) in a first base system. Each of the N digits may include q bits, and the first base system may be a base $2^q$ system. The N-digit base-$2^q$ input packet mat be expressed as $X = [x_1 x_2 \ldots x_N]_2^q$, where each of digits $x_1, x_2, \ldots x_N$ has a value from 0 to $2^q-1$.

The transition encoder 100 then performs a base-conversion on each of the input packets to generate a base-converted packet that includes a plurality of converted digits in a second base system (S304). The second base system has a base value lower than that of the first base system by two. For example, the second base system may be a base $2^q-2$ system. The number of converted digits in the base-converted packet is one more than a number of the plurality of digits in the input packet. In other words, the converted digits have one overhead digit ($y_0$). The (N+1)-digit base-$(2^q-2)$ base-converted packet may be expressed as $X = [y_0 y_1 y_2 \ldots y_N]_2^q{}_{-2}$, where each of the plurality of digits $y_1, \ldots y_N$ has a value from 0 to $2^q-3$.

In some examples, the overhead digit $y_0$ may have a value from 0 to $2^q-3$, and the values N and q have a relationship expressed as $N \leq 1/(\log(2q)/\log(2q-2)-1)$. In other examples, the overhead digit $y_0$ may be a single binary bit, and the values N and q have a relationship expressed as $N \leq \log 2/(\log(2q) - \log(2q-2))$.

Figure 4:
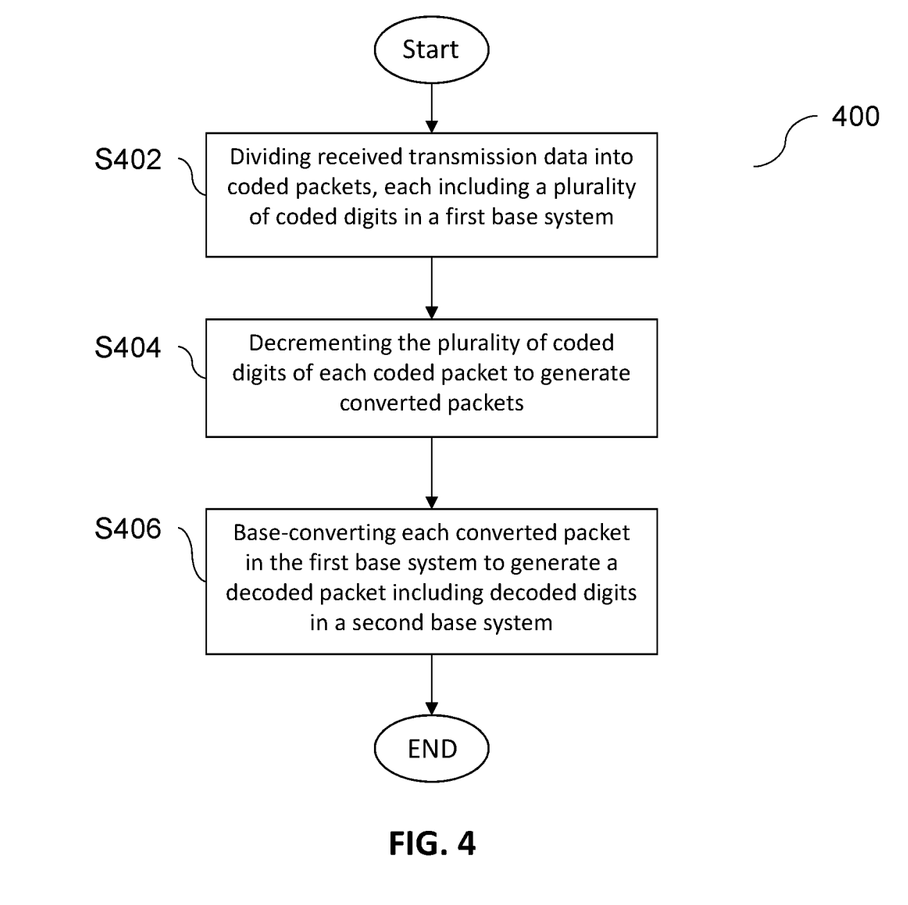
FIG. 4 illustrates a process of decoding transmission data, according to some embodiments of the present disclosure.

The transition encoder 100 then increments the converted digits of each converted packet by one to generate a coded packet for transmission through the communication channel 15 (S306). The transmitter 10 (e.g., transition encoder 100) transmits transmission data that includes the coded packets through the communication channel 15. The coded packets have a run-length less than or equal to a set run-length value or limit (e.g., less than or equal to 2q-2), which permits the receiver 10 to perform clock recovery on the received transmission data. Each coded packet may be expressed as $X' = \{y_0+1, y_1+1, y_2+1, \ldots, y_N+1\}$, where each of coded digits $y_0+1 \ldots y_N+1$ do not include all zeros or all ones. In other words, each coded packet includes at least one bit transition FIG. 4 illustrates a process 400 of decoding transmission data, according to some embodiments of the present disclosure.

In some embodiments, the receiver 20 (e.g., the transition decoder 200) decodes the transmission data received through the communication channel 15.

The transition decoder 200 divides the received transmission data into a plurality of coded packets (S402). Each coded packet of the plurality of coded packets includes a plurality of coded digits (e.g., N digits) in a first base system. Each of the coded packets has a run-length less than or equal to a set run-length value, which allows the receiver 200 to extract a clock signal from the transmission data.

The transition decoder 200 then decrements the plurality of coded digits of each coded packet by one to generate a converted packet (S404) including converted digits.

The transition decoder 200 then performs base-conversion on the converted packet from the first base system to generate a decoded packet comprising a plurality of decoded digits in a second base system (S406). The second base system has a base value greater than that of the first base system by two. In some examples, the number of coded digits in each coded packet is one more than the number of decoded digits in each decoded packet.

Accordingly, as described above, the transition encoder 100 is capable of efficiently encoding a transmission stream to enable clock recovery at the receiver 20. In some embodiments, the transition encoder 100 losslessly encodes the data stream using very-low-overhead and high-code-efficiency run-length-limited transition codes.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept". Also, the term "exemplary" is intended to refer to an example or illustration.

As used herein, the terms "use", "using", and "used" may be considered synonymous with the terms "utilize", "utilizing", and "utilized", respectively.

Further, the use of "may" when describing embodiments of the inventive concept refers to "one or more embodiments of the inventive concept." Also, the term "exemplary" is intended to refer to an example or illustration.

While this disclosure has been described in detail with particular references to illustrative embodiments thereof, the embodiments described herein are not intended to be exhaustive or to limit the scope of the disclosure to the exact forms disclosed. Persons skilled in the art and technology to which this disclosure pertains will appreciate that alterations and changes in the described structures and methods of assembly and operation can be practiced without meaningfully departing from the principles, and scope of this disclosure, as set forth in the following claims and equivalents thereof.

What is claimed is:

1. A method of encoding input data, the method comprising:
    dividing the input data into a plurality of data packets, an input packet of the plurality of data packets comprising a plurality of digits in a first base system;
    base-converting the input packet from the first base system to generate a base-converted packet comprising a plurality of converted digits in a second base system, the second base system having a base value lower than that of the first base system; and
    incrementing the converted digits to generate a coded packet for transmission through a communication channel.

2. The method of claim 1, wherein a number of the plurality of converted digits in the base-converted packet is one more than a number of the plurality of digits in the input packet.

3. The method of claim 1, wherein the incrementing the converted digits comprises:
    incrementing each of the converted digits by one to generate coded digits, the coded packet comprising the coded digits.

4. The method of claim 1, wherein the coded packet has a run-length less than or equal to a set run-length value.

5. The method of claim 1, wherein the input packet comprises N digits, each of the N digits comprising q bits,
    wherein the first base system is a base $2^q$ system, and the second base system is a base $2^q-2$ system, and
    wherein the coded packet has a run-length less than or equal to 2q−2.

6. The method of claim 1, wherein the input packet comprises N digits, each of the N digits comprising q bits, and
    wherein the first base system is a base $2^q$ system, and the second base system is a base $2^q-3$ or less system.

7. The method of claim 1, wherein the input packet is an N-digit base-$2^q$ number expressed as $$X=[x_1 x_2 \ldots x_N]_{2^q},$$

wherein each of digits $x_1, x_2, \ldots x_N$ has a value from 0 to $2^q-1$,
wherein the base-converted packet is an (N+1)-digit base-($2^q-2$) number expressed as $$X=[y_0 y_1 y_2 \ldots y_N]_{2^q-2}, \text{ and}$$

wherein each of the plurality of digits $y_1, \ldots y_N$ has a value from 0 to $2^q-3$.

8. The method of claim 7, wherein an overhead digit $y_0$ has a value from 0 to $2^q-3$, and
    wherein values N and q have a relationship expressed as:

$$N<=1/(\log(2^q)/\log(2^q-2)-1).$$

9. The method of claim 7, wherein an overhead digit $y_0$ is a single binary bit, and
    wherein values N and q have a relationship expressed as:

$$N<=\log 2/(\log(2^q)-\log(2^q-2)).$$

10. The method of claim 7, wherein the coded packet is expressed as $$X' = \{y_0+1, y_1+1, y_2+1, \ldots, y_N+1\},\text{ and}$$

wherein each of coded digits $y_0+1 \ldots y_N+1$ do not include all zeros or all ones.

11. The method of claim 1, wherein the base-converting the input packet comprises an iterative process comprising only shift, addition, and subtraction operations.

12. The method of claim 1, wherein the coded packet comprises at least one bit transition.

13. The method of claim 1, further comprising:
transmitting transmission data to a receiver through the communication channel, the transmission data comprising the coded packet.

14. A transition encoder for encoding input data, the transition encoder comprising:
a processor; and
a processor memory local to the processor, wherein the processor memory has stored thereon instructions that, when executed by the processor, cause the processor to perform:
dividing the input data into a plurality of data packets, an input packet of the plurality of data packets comprising a plurality of digits in a first base system;
base-converting the input packet from the first base system to generate a base-converted packet comprising a plurality of converted digits in a second base system, the second base system having a base value lower than that of the first base system; and
incrementing the converted digits to generate a coded packet for transmission through a communication channel.

15. A method of decoding transmission data, the method comprising:
dividing the transmission data into a plurality of coded packets, a coded packet of the plurality of coded packets comprising a plurality of coded digits in a first base system;
decrementing the plurality of coded digits to generate a converted packet; and
base-converting the converted packet from the first base system to generate a decoded packet comprising a plurality of decoded digits in a second base system, the second base system having a base value greater than that of the first base system.

16. The method of claim 15, wherein a number of the plurality of coded digits in the coded packet is one more than a number of the plurality of decoded digits in the decoded packet.

17. The method of claim 15, wherein the decrementing the coded digits comprises:
decrementing each of the coded digits by one to generate converted digits, the converted packet comprising the converted digits.

18. The method of claim 15, wherein each of the coded packets has a run-length less than or equal to a set run-length value.

19. The method of claim 15, further comprising:
receiving the transmission data from a transmitter through a communication channel.

20. A transition decoder for decoding a transmission data, the transition decoder comprising:
a processor; and
a processor memory local to the processor, wherein the processor memory has stored thereon instructions that, when executed by the processor, cause the processor to perform:
dividing the transmission data into a plurality of coded packets, a coded packet of the plurality of coded packets comprising a plurality of coded digits in a first base system;
decrementing the plurality of coded digits to generate a converted packet; and
base-converting the converted packet from the first base system to generate a decoded packet comprising a plurality of decoded digits in a second base system, the second base system having a base value greater than that of the first base system.

* * * * *